US010293316B2

(12) United States Patent
Song

(10) Patent No.: US 10,293,316 B2
(45) Date of Patent: May 21, 2019

(54) PHOTO-RESISTOR DRAW DEVICES

(71) Applicant: Shenzhen China Star Optoelectronics Technology Co., Ltd., Shenzhen, Guangdong (CN)

(72) Inventor: Jiangjiang Song, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 427 days.

(21) Appl. No.: 14/768,403

(22) PCT Filed: Jul. 15, 2015

(86) PCT No.: PCT/CN2015/084021
§ 371 (c)(1),
(2) Date: Aug. 17, 2015

(87) PCT Pub. No.: WO2017/008261
PCT Pub. Date: Jan. 19, 2017

(65) Prior Publication Data
US 2017/0225137 A1 Aug. 10, 2017

(30) Foreign Application Priority Data
Jul. 10, 2015 (CN) .......................... 2015 1 0405817

(51) Int. Cl.
*B01F 7/00* (2006.01)
*B01F 7/20* (2006.01)
(Continued)

(52) U.S. Cl.
CPC .......... *B01F 15/0291* (2013.01); *B01F 7/007* (2013.01); *B01F 7/0025* (2013.01);
(Continued)

(58) Field of Classification Search
CPC .... B01F 15/0272; B01F 15/0291; B01F 7/20; B01F 7/0005; B01F 7/00058;
(Continued)

(56) References Cited

U.S. PATENT DOCUMENTS 2,896,925 A * 7/1959 Place .................. B01F 7/00475
366/331
2,896,926 A * 7/1959 Chapman ............ B01F 11/0082
165/72
(Continued)

FOREIGN PATENT DOCUMENTS

CN 202293674 U 7/2012
CN 203916533 U 11/2014
(Continued)

OTHER PUBLICATIONS

Machine Translation of JP 3-211819, Patent No. JP403211819A publication date Sep. 17, 1991, Miyasato, 6 pages.*

*Primary Examiner* — Tony G Soohoo
(74) *Attorney, Agent, or Firm* — Andrew C. Cheng

(57) ABSTRACT

A photo-resistor draw device includes a photo-resistor bottle, a sealing cover arranged on an inlet of the bottle, an air tube passing through the sealing cover and being inserted within the photo-resistor bottle, and a photo-resistor draw tube. The photo-resistor bottle further includes a stirring component for stirring the photo-resistors. As the novel photo-resistor draw device includes the stirring component for preventing the high-precision photo-resistor from being subsided. Not only the stability of the color filter products may be enhanced, but also the defects may be eliminated. As such, the yield rate of the products is improved.

2 Claims, 3 Drawing Sheets

(51) Int. Cl.
*B01F 7/22* (2006.01)
*G03F 7/00* (2006.01)
*G03F 7/16* (2006.01)
*B01F 15/00* (2006.01)
*B01F 15/02* (2006.01)
*C03C 17/00* (2006.01)

(52) U.S. Cl.
CPC ...... *B01F 7/00033* (2013.01); *B01F 7/00141* (2013.01); *B01F 7/00633* (2013.01); *B01F 7/20* (2013.01); *B01F 7/22* (2013.01); *B01F 15/00506* (2013.01); *B01F 15/028* (2013.01); *B01F 15/0272* (2013.01); *C03C 17/001* (2013.01); *G03F 7/0012* (2013.01); *G03F 7/16* (2013.01); *B01F 7/0005* (2013.01); *B01F 7/00058* (2013.01); *B01F 2015/00084* (2013.01); *B01F 2215/0093* (2013.01); *C03C 2217/70* (2013.01)

(58) Field of Classification Search
CPC .............. B01F 7/00066; B01F 7/00075; B01F 15/00941; B01F 7/18; B01F 7/00141; B01F 15/0267
USPC .......................................... 366/195, 196, 194
See application file for complete search history.

(56) References Cited

U.S. PATENT DOCUMENTS

| | | | | |
|---|---|---|---|---|
| D195,728 S * | 7/1963 | Freedman et al. | ........ | 416/223 R |
| 3,455,540 A * | 7/1969 | Marcmann | .......... | B01F 7/00066 366/129 |
| 3,468,520 A * | 9/1969 | Bott | .................... | B01F 11/0088 366/191 |
| 3,647,632 A * | 3/1972 | Johnson et al. | ....... | C12M 27/02 210/360.1 |
| 4,054,272 A * | 10/1977 | Cooke | ................. | B01F 7/00141 366/327.3 |
| 4,166,768 A * | 9/1979 | Tolbert | ................... | B01D 29/11 435/297.3 |
| 4,178,209 A * | 12/1979 | Tolbert | ................... | B01D 29/11 435/297.2 |
| 4,289,854 A * | 9/1981 | Tolbert | ................. | B01F 7/0005 366/273 |
| 4,601,583 A * | 7/1986 | Amorese | ............. | B01F 7/00016 366/330.1 |
| 4,639,422 A * | 1/1987 | Geimer | ................ | C12M 25/16 435/297.3 |
| 4,649,118 A * | 3/1987 | Anderson | ............... | B01F 11/04 366/255 |
| 4,872,764 A * | 10/1989 | McClean | ............... | A47J 43/044 366/251 |
| 5,002,890 A * | 3/1991 | Morrison | ............... | C12M 23/06 210/396 |
| 5,126,269 A * | 6/1992 | Fike | ....................... | C12M 27/02 435/297.3 |
| 5,885,001 A * | 3/1999 | Thomas | .............. | B01F 7/00066 366/308 |
| 5,941,636 A * | 8/1999 | Lu | ....................... | B01F 7/00066 366/249 |
| 6,955,461 B2 * | 10/2005 | Kar | ....................... | B01F 3/1221 366/196 |
| 7,422,363 B2 * | 9/2008 | Parker | ................. | B01F 7/00266 366/129 |
| 7,484,879 B2 * | 2/2009 | Hamilton, Jr. | ........ | B01F 7/0005 366/129 |
| 7,598,075 B2 * | 10/2009 | Smith | .................... | C12M 27/02 435/297.2 |
| 9,339,776 B2 * | 5/2016 | Eggler | ................ | B01F 7/00066 |
| 9,604,183 B2 * | 3/2017 | Dinnison | ............ | B01F 7/00058 |
| 2005/0007874 A1 * | 1/2005 | Roszczenko | ........ | B01F 3/04248 366/270 |

FOREIGN PATENT DOCUMENTS

| | | | |
|---|---|---|---|
| JP | 3-211819 | * | 9/1991 |
| JP | 03211819 A | * | 9/1991 |
| JP | 3211819 A | | 9/1991 |

* cited by examiner

PHOTO-RESISTOR DRAW DEVICES

BACKGROUND OF THE INVENTION

1. Field of the Invention

The present disclosure relates to a high precision photoresist supply technology, and more particularly to a photo-resistor draw device.

2. Description of the Related Art

Colorful photo-resistor is a display source of color filters, and mainly includes R, G, B photo-resistors. In the manufacturing process of colorful photo-resistors, first, the distributed colorful photo-resistors are coated on the glass substrates having a black matrix formed thereon. After the process of soft baking, exposing and aligning, developing, photo-resistor striping, and hard baking has been repeatedly for three times, the R, G, B patterns are formed. For the display products with high resolution rate, the black matrix being arranged on the color-filtering side needs to adopt the black matrix photo-resistors having high precision. However, the black matrix photo-resistors having high precision may have paint subsidation issue, which causes un-uniform photo-resistors within the photo-resistor barrel and the particle size may increase. When the photo-resistor draw device of conventional photo-resistor coating machine is adopted to draw the photo-resistor, the performance of the color filter products may not be stable, which affects the yield rate of the products.

SUMMARY

The present disclosure relates to a photo-resistor draw device having a stable performance and high yield rate.

In one aspect, a photo-resistor draw device includes: a photo-resistor bottle, a sealing cover arranged on an inlet of the bottle, an air tube passing through the sealing cover and being inserted within the photo-resistor bottle, and a photo-resistor draw tube, and the photo-resistor bottle further including a stirring component for stirring the photo-resistors.

Wherein the stirring component further comprises a rotating axis and a plurality of blades tiltedly connected with the rotating axis, and the stirring component is rotated so as to push the photo-resistors within the bottle from the inlet toward a bottom of the bottle.

Wherein a plurality of connection portions is arranged on a length direction of the rotating axis for connecting the blades, and the connection portions are folded along the rotating axis in a top-down direction when being applied with external force.

Wherein the connection portions are soft plastic.

Wherein the rotating axis is the photo-resistor draw tube.

Wherein the rotating axis is a tube sleeved on the photo-resistor draw tube, and a sealing member is provided between an internal wall of the tube and an outer wall of the photo-resistor draw tube.

Wherein the rotating axis is a stirring bar being arranged alone.

Wherein the rotating axis is the photo-resistor draw tube.

Wherein the rotating axis is a tube sleeved on the photo-resistor draw tube, and a sealing member is provided between an internal wall of the tube and an outer wall of the photo-resistor draw tube.

Wherein the rotating axis is a stirring bar being arranged alone.

Wherein the rotating axis is the photo-resistor draw tube.

Wherein the rotating axis is a tube sleeved on the photo-resistor draw tube, and a sealing member is provided between an internal wall of the tube and an outer wall of the photo-resistor draw tube.

Wherein the rotating axis is a stirring bar being arranged alone.

In view of the above, the photo-resistor draw device includes a stirring component for preventing the high-precision photo-resistor from being subsided. Not only the stability of the color filter products may be enhanced, but also the defects may be eliminated. As such, the yield rate of the products is improved.

DETAILED DESCRIPTION OF THE EMBODIMENTS

Embodiments of the invention will now be described more fully hereinafter with reference to the accompanying drawings, in which embodiments of the invention are shown.

Figure 1:
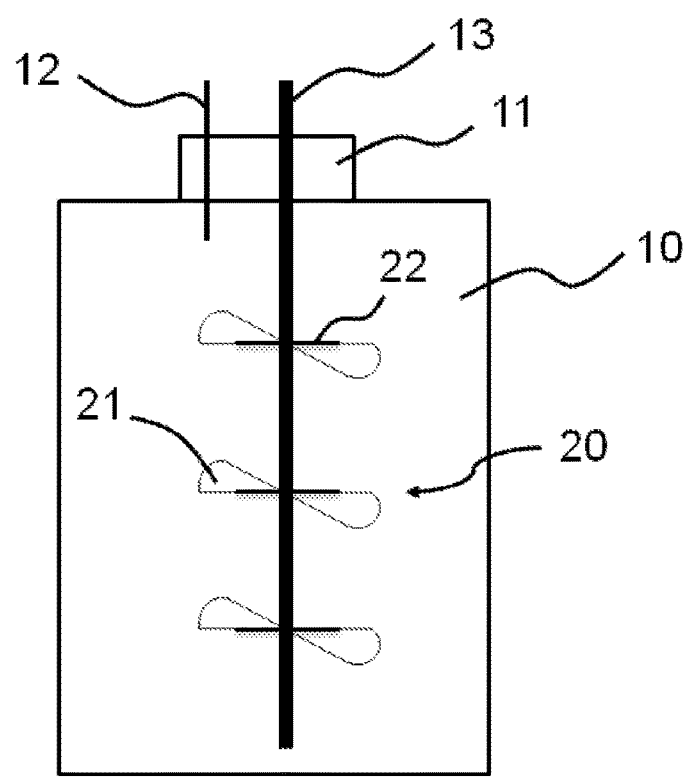
FIG. 1 is a schematic view of the photo-resistor draw device in accordance with a first embodiment.

FIG. 1 is a schematic view of the photo-resistor draw device in accordance with a first embodiment. The photo-resistor draw device includes a photo-resistor bottle 10, a sealing cover 11 arranged on an inlet of the bottle, an air tube 12 passing through the sealing cover 11 and being inserted within the photo-resistor bottle 10, and a photo-resistor draw tube 13. The photo-resistor bottle 10 also includes a stirring component 20 for stirring the photo-resistors.

The air tube 12 may inject dry and clean air toward the photo-resistor bottle 10 to provide a draw force toward the bottle. The photo-resistor draw tube 13 is inserted into a bottom of the photo-resistor bottle 10. Under the forces of the pressure within the bottle, the photo-resistors may be drew out of the bottle and then a coating operation may be conducted afterward.

The stirring component 20 includes a rotating axis and a plurality of blades 21 tiltedly connected with the rotating axis. In an example, the rotating axis is the photo-resistor draw tube 13. The tilt angles between each of the blades 21 and the photo-resistor draw tube 13 is substantially the same. When the photo-resistor draw tube 13 is rotated, the blades 21 may generate the force in a top-down direction for the photo-resistors within the bottle such that the photo-resistors within the photo-resistor bottle 10 are pushed from an inlet of the bottle to the bottom of the bottle, which contributes to the photo-resistor mixture.

In addition, a plurality of connection portions 22 is arranged on the length direction of the rotating axis for connecting the blades 21. The connection portions 22 are made by soft plastic materials, and may be folded along the rotating axis in the top-down direction. When the stirring component 20 is installed via the sealing cover 11, the blade 21 may be folded upward and then the stirring component 20 may be installed within the photo-resistor bottle 10.

In view of the above, the photo-resistor draw device includes the stirring component. The photo-resistors are fully stirred and then are drew from the bottom of the bottle via the photo-resistor draw tube, which ensures that the drew photo-resistors are fully stirred. In this way, the high-precision photo-resistors are prevented from being subsided such that the stability of the color filter products and the yield rate are enhanced.

Figure 2:
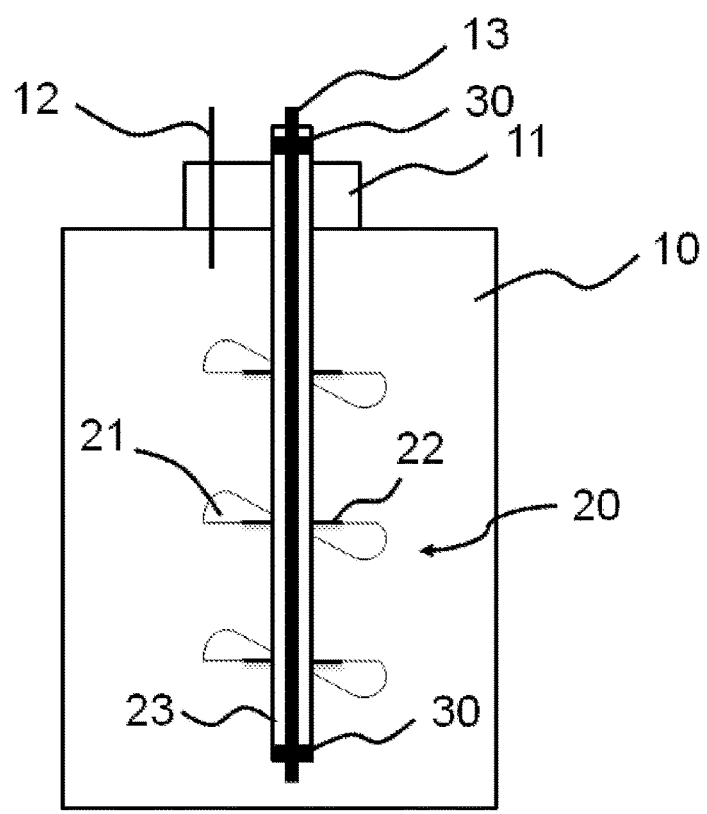
FIG. 2 is a schematic view of the photo-resistor draw device in accordance with a second embodiment.

FIG. 2 is a schematic view of the photo-resistor draw device in accordance with a second embodiment. Compared with the first embodiment, the rotating axis of the second embodiment is a hollow tube 23 sleeved on the photo-resistor draw tube 13. A sealing member 30 is provided between an internal wall of the hollow tube 23 and an outer wall of the photo-resistor draw tube 13 so as to prevent the photo-resistors from being ejected out from the bottom of the color-filtering layer 23.

Figure 3:
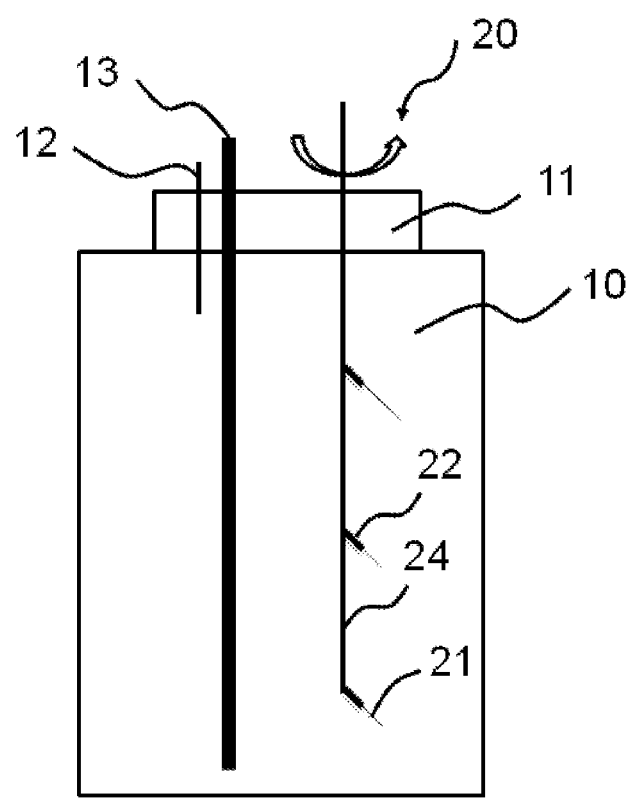
FIG. 3 is a schematic view of the photo-resistor draw device in accordance with a third embodiment.

FIG. 3 is a schematic view of the photo-resistor draw device in accordance with a third embodiment. Compared with the first embodiment, the rotating axis of the second embodiment is the stirring bar 24 being arranged alone. After being inserted toward the bottle via the sealing cover 11, a portion of the stirring bar 24 is place out of the bottle. During a drawing process, the stirring bar 24 may be stirred manually by users or automatically so as to mix the photo-resistors.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A photo-resistor draw device, comprising:
   a photo-resistor bottle, a sealing cover arranged on an inlet of the bottle, an air tube passing through the sealing cover and being inserted within the photo-resistor bottle, and a photo-resistor draw tube, and the photo-resistor bottle further comprising a stirring component for stirring the photo-resistors;
   wherein the stirring component further comprises a rotating axis and a plurality of blades tiltedly with the rotating axis, and each of the blades is parallel with each other, and the stirring component is rotated so as to push the photo-resistors within the bottle from the inlet toward a bottom of the bottle; and
   wherein a plurality of connection portions is arranged on a length direction of the rotating axis for connecting the blades; and
   wherein the rotating axis is a tube sleeved on the photo-resistor draw tube, and a sealing member is provided between an internal wall of the tube and an outer wall of the photo-resistor draw tube and is arranged in the bottom of the tube.

2. The photo-resistor draw device as claimed in claim 1, wherein the connection portions are soft plastic.

* * * * *